(12) United States Patent
Karasawa

(10) Patent No.: US 7,135,204 B2
(45) Date of Patent: Nov. 14, 2006

(54) METHOD OF MANUFACTURING A WIRING BOARD

(75) Inventor: Fumiaki Karasawa, Ina (JP)

(73) Assignee: Seiko Epson Corporation (JP)

( * ) Notice: Subject to any disclaimer, the term of this patent is extended or adjusted under 35 U.S.C. 154(b) by 224 days.

(21) Appl. No.: 10/758,698

(22) Filed: Jan. 15, 2004

(65) Prior Publication Data

US 2004/0172819 A1 Sep. 9, 2004

(30) Foreign Application Priority Data

Jan. 16, 2003 (JP) ............................. 2003-008462

(51) Int. Cl.
*B05D 5/12* (2006.01)
(52) U.S. Cl. ................ 427/117; 427/123; 427/259; 427/282; 427/96.1; 427/98.4
(58) Field of Classification Search ................ 427/117, 427/123, 256, 259, 282, 96.1, 98.4
See application file for complete search history.

(56) References Cited

U.S. PATENT DOCUMENTS

| | | | | |
|---|---|---|---|---|
| 5,973,931 A | * | 10/1999 | Fukasawa | 361/774 |
| 6,441,316 B1 | * | 8/2002 | Kusui | 174/260 |
| 6,448,504 B1 | * | 9/2002 | Taguchi | 174/255 |
| 6,642,615 B1 | * | 11/2003 | Hashimoto et al. | 257/698 |
| 6,734,557 B1 | * | 5/2004 | Taniguchi et al. | 257/738 |
| 2003/0080420 A1 | * | 5/2003 | Ohara | 257/737 |

* cited by examiner

*Primary Examiner*—Brian K. Talbot
(74) *Attorney, Agent, or Firm*—Harness, Dickey & Pierce, P.L.C.

(57) ABSTRACT

A method of manufacturing a wiring board is provided. The method includes performing a plating process to a land, in a condition that a resist film having an opening for exposing at least the center of the land is formed on a substrate with wires having the land formed thereon, so that a fist portion of an edge of the opening is disposed on the substrate and a second portion of the edge is disposed on the land.

4 Claims, 2 Drawing Sheets

METHOD OF MANUFACTURING A WIRING BOARD

RELATED APPLICATIONS

The present application claims priority to Japanese Patent Application No. 2003-008462 filed Jan. 16, 2003 which is hereby expressly incorporated by reference.

BACKGROUND OF THE INVENTION

1. Field of the Invention

The present invention relates to a wiring board, a manufacturing method thereof, a semiconductor device, an electronic module, and an electronic apparatus.

2. Related Art

It is a conventional technology to form a resist film having an opening on a wiring board in order to protect wiring. It is possible to manufacture a more reliable wiring board by adjusting the shapes of the opening of the resist film and a land of the wiring.

The present invention aims to provide a reliable wiring board, a manufacturing method thereof, a reliable semiconductor device, a reliable electronic module, and a reliable electronic apparatus.

SUMMARY OF THE INVENTION

A method of manufacturing a wiring board according to an embodiment of the present invention comprises performing a plating process on a land in a condition that a resist film having an opening for exposing at least the center of the land is formed on a substrate with a wire having the land formed thereon so that a fist portion of an edge of the opening is disposed on the substrate and a second portion of the edge is disposed on the land. According to the embodiment of the present invention, at least a part of the edge of the opening of the resist film is disposed on the substrate. Since the resist film has strong adhesiveness with the substrate, at least a part of the edge of the opening of the resist film can have strong adhesiveness with the substrate. Thus, foreign matters can be prevented from breaking in between the resist film and the substrate or between the resist film and the land, which results in the manufacturing of a reliable circuit board.

A method of manufacturing a wiring board according to an embodiment of the present invention comprises forming a resist film on a substrate with a wire having a land having a shape including a depression formed thereon, the resist film having an opening for exposing at least the center of the land, so that, taking the smallest circumscribing rectangle of the land as a reference, every side of the rectangle is covered by the resist film while the depression of the land is partially exposed through the opening. According to the embodiment of the present invention, since every side of the smallest circumscribing rectangle of the land is covered by the resist film, each vertex of the land is covered by the resist film. Thus, a reliable circuit board having a land which is difficult to peel off can be manufactured.

A method of manufacturing a wiring board according to an embodiment of the present invention comprises forming a resist film on a substrate with a wire having a land formed thereon, the resist film having an opening for exposing a part of the periphery and the center of the land, so that a sum of the length of a first side of the land which is covered by the resist film is larger than a sum of a second side which is exposed through the opening. According to the embodiment of the present invention, the sum of the length of the side covered by the resist film is larger than the sum of the length of the side not covered by the resist film. Accordingly, it becomes possible to prevent solder from flowing outside the land when, for example, forming the solder on the land. Thus, it is possible to manufacture a reliable wiring board.

In the method of manufacturing a wiring board described above, the land has a shape including a depression, and the resist film can be formed so that the depression is partially exposed through the opening.

In the method of manufacturing a wiring board described above, a plating process may be preformed on the land with the resist film formed.

A wiring board according to an embodiment of the present invention is manufactured by the method described above.

A wiring board according to an embodiment of the present invention comprises a substrate, a wire formed on the substrate and having a land having a shape including a depression, and a resist film having an opening and covering the wire so that a part of the periphery and the center of the land are exposed via the opening, wherein, taking the smallest circumscribing rectangle of the land as a reference, the resist film is formed so that every side of the rectangle is covered by the resist film while the depression of the land is partially exposed through the opening. According to the embodiment of the present invention, since every side of the smallest circumscribing rectangle of the land is covered by the resist film, each vertex of the land is covered by the resist film. Thus, a reliable circuit board having a land which is difficult to peel off can be provided.

A wiring board according to an embodiment of the present invention comprises a substrate, a wire formed on the substrate and having a land, and a resist film having an opening and covering the wire so that a part of the periphery and the center of the land are exposed via the opening, wherein the resist film is formed so that a sum of the length of a first side of the land which is covered by the resist film is larger than a sum of a second side which is exposed through the opening. According to the embodiment of the present invention, the sum of the length of the side covered by the resist film is larger than the sum of the length of the side not covered by the resist film. Accordingly, it becomes possible to prevent solder from flowing outside the land when, for example, forming the solder on the land. Thus, it is possible to provide a reliable wiring board.

In the wiring board described above, the land has a shape including a depression, and the depression can be partially exposed through the opening.

A semiconductor device according to an embodiment of the present invention comprises the wiring board described above.

An electronic module according to an embodiment of the present invention comprises the semiconductor device described above.

An electronic apparatus according to an embodiment of the present invention comprises the electronic module described above.

DETAILED DESCRIPTION

Figure 1:
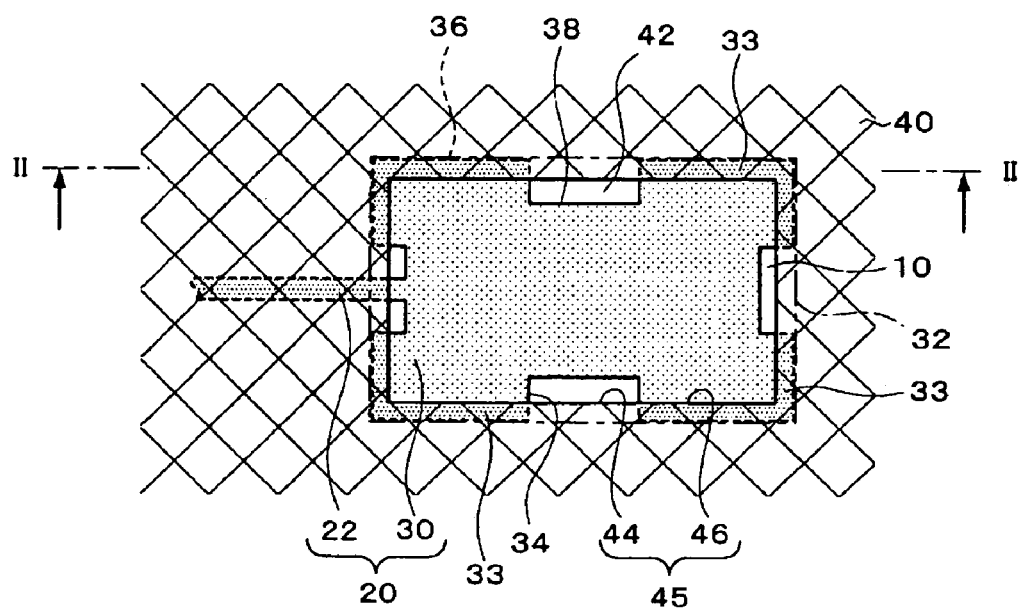
FIG. 1 is a drawing showing a wiring board according to an embodiment of the present invention.
Figure 2:
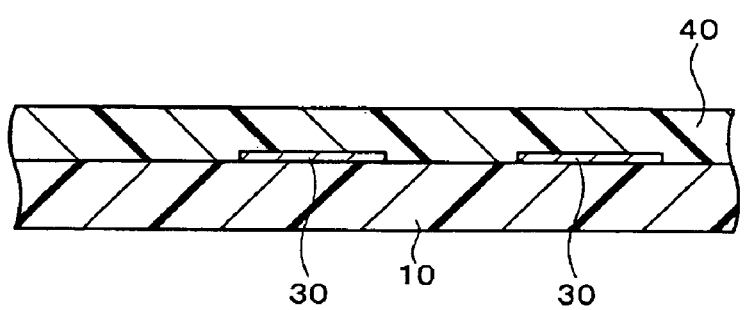
FIG. 2 is a cross-sectional view along the II—II line of FIG. 1.

Hereinafter, preferred embodiments of the present invention are described referring to the accompanying drawings. Note that the present invention is not limited to the embodiments described bellow. FIG. 1 shows a partial enlarged view of a wiring board according to an embodiment of the present invention, and FIG. 2 shows a cross-sectional view along the line II—II in FIG. 1.

Wiring Board

The wiring board according to the present embodiment has a substrate 10. Materials of the substrate 10 may include, but are not limited to, an organic material (e.g., an epoxy substrate), an inorganic material (e.g., a ceramic substrate, a glass substrate), and a combination thereof (e.g., a glass-epoxy substrate). The substrate 10 can be a flexible substrate such as a polyester substrate and a polyimide substrate. The substrate 10 can also be a substrate for COF (chip on film) or a substrate for TAB (tape automated bonding). Furthermore, the shape and the thickness of the substrate 10 are not necessarily predetermined as well.

The wiring board also has a plurality of wires 20. The wires 20 can be formed on one surface of the substrate 10 or on both surfaces thereof. The wires 20 mean at least two parts which are intended to have an electrical connection, and the plurality of wires 20 can be called a wiring pattern. The wires 20 can be formed of a single layer or a plurality of layers.

The wires 20 consist of a land (a pad) 30 and a line 22 connecting to the land 30. The land 30 is a terminal for an electrical connection to an electronic element. The line 22 is an electric cable for supplying the land 30 with an electric signal. The land 30 can be a terminal suitable for surface mounting or a terminal suitable for insertion mounting having a through hole. Furthermore, as shown in FIG. 1, the land 30 can be of a shape having a protrusion 33 and a depression 34.

The wiring board also has a resist film 40 in which an opening 42 is formed. The resist film 40 can cover the wires 20 so that a part of the periphery and the center of the land 30 are exposed from the opening 42. Also, the resist film 40 can be formed so that, taking a rectangle 32 that is the smallest among those circumscribing the land 30 as a reference, the resist film 40 covers every side of the rectangle 32 with a part of the depression 34 of the land 30 exposed from the opening 42. Generally speaking, a land whose periphery is formed with a plurality of sides is easy to peel off at an apex from a substrate. However, in the wiring board according to the present embodiment, the protrusion 33 is covered by the resist film 40, and accordingly, each apex of the land 30 is covered by the resist film 40 because each side of the rectangle 32, which is the smallest among those circumscribing the land 30, is covered by the resist film 40. Accordingly, it is possible to provide a reliable circuit board including a land 30 which is not easily peeled off of the substrate 10. In addition, the resist film 40 can be made of an insulating material (e.g., resin). Furthermore, the depression 34 can be formed except on the corners of the rectangle 32.

The resist film 40 can be formed so that a sum of the length of a first side 36 of the land 30 which is covered by the resist film 40 is larger than a sum of a second side 38 which is exposed through the opening 42. In other words, the resist film 40 can be formed so that, in the periphery of the land 30, a sum of the length of sides (the second side 38) exposed from the opening 42 is smaller than a sum of the length of sides (the first side 36) covered by the resist film 40. If the land 30 has a shape including the protrusion 33 and the depression 34, the resist film 40 can be formed so that a part of the protrusion 33 is covered by the resist film 40 while a part of the depression 34 is exposed from the opening 42. In a wiring board in which a longer part of a peripheral side of a land is exposed from an opening of a resist film, solder may flow outside of the land from the exposed side. However, in the wiring board according to the present embodiment, the sum of the length of the second side 38 exposed from the opening 42 is shorter than the sum of the length of the first side 36 covered by the resist film 40. Accordingly, it becomes difficult for solder formed on the land 30 in a later process to flow outside the land 30 (more precisely, on a part of the substrate 10 exposed from the opening 42). Thus, it is possible to provide a reliable wiring board in which solder can be formed as designed.

Figure 3:
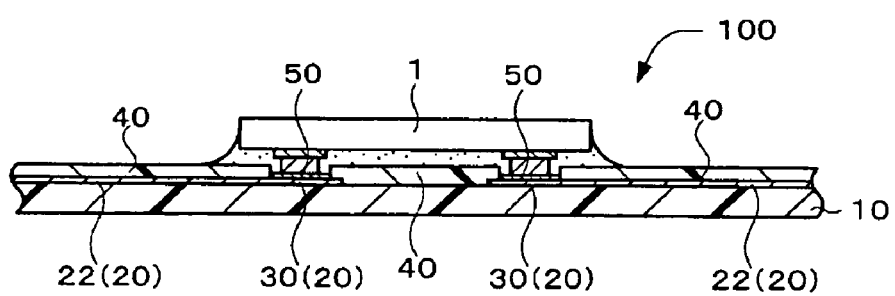
FIG. 3 is a drawing showing a semiconductor device having the wiring board according to the embodiment of the present invention.

Additionally, a metal coating 50 can be formed on the wires 20 (See FIG. 3). The metal coating 50 can be formed only on a portion of the land 30 exposed from the opening 42. The metal coating 50 can be formed of gold.

Figure 4:
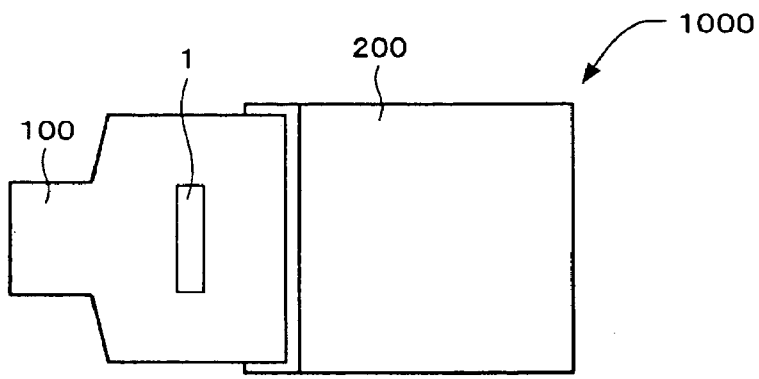
FIG. 4 is a drawing showing an electronic module according to an embodiment of the present invention.
Figure 5:
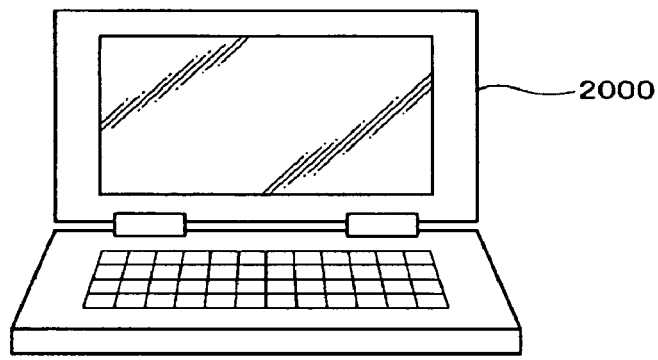
FIG. 5 is a drawing showing an electronic apparatus according to an embodiment of the present invention.
Figure 6:
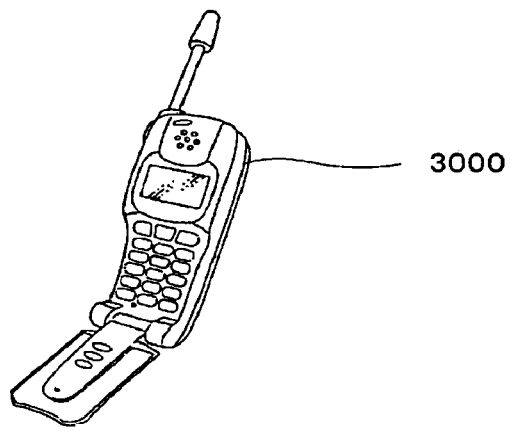
FIG. 6 is a drawing showing an electronic apparatus according to an embodiment of the present invention.

FIG. 3 shows a semiconductor device 100 equipped with a semiconductor chip 1 mounted on the above described wiring board. FIG. 4 shows an electronic module 1000 having the semiconductor device 100. The electronic module 1000 has the semiconductor device 100 and a substrate 200. The substrate 200 can be a glass substrate. The substrate 200 can be a part of an electro optical panel (a liquid crystal panel, an electroluminescent panel, or the like). As an electronic apparatus having the electronic module, a laptop personal computer 2000 is shown in FIG. 5, and a cellular phone 3000 is shown in FIG. 6.

Manufacturing Method of the Wiring Board

Hereinafter, a manufacturing method of the wiring board according to an embodiment of the present invention is explained.

First, the wires 20 having the land 30 are formed on the substrate 10. The wires 20 can be formed, for example, by photolithographic processing and then etching a metal foil such as a copper foil attached on the substrate 10 with adhesive not shown in the drawings. In this case, a three-layered board is obtained. Alternatively, it is possible to obtain a two-layered board by forming the wires 20 without the adhesive. For example, the wires 20 can be formed by sputtering. Otherwise, the additive process of forming the wires 20 by the electroless plating can be applied. Furthermore, the wires 20 can be formed so that the land 30 has a shape including the protrusion 33 and the depression 34.

Next, the resist film 40 having the opening 42 for exposing at least the center of the land 30 is formed. The resist film 40 can be formed by any known method (e.g., the screen printing method). The resist film 40 can be formed so that a first portion 44 of an edge 45 of the opening 42 is disposed on the substrate 10 and a second portion 46 of the edge 45 is disposed on the land 30. That is, the resist film 40 can be formed so that the edge 45 of the opening 42 has the first portion 44 disposed on the substrate 10 and the second portion 46 disposed on the land 30. In this case, the first portion 44 contacts the substrate 10 and the second portion 46 contacts the land 30 (See FIG. 2). Note that the land 30 can have a shape including the protrusion 33 and the depression 34 where the protrusion 33 is partially covered by the resist film 40 and the depression 34 is partially exposed through the opening 42.

In addition, the resist film 40 can be formed so that part of the periphery and the center of the land 30 are exposed via the opening 42. In this case, the land 30 can have a shape including the depression 34. Also in this case, taking the rectangle 32, which is the smallest among those circumscribing the land 30, as a reference, the resist film 40 can be formed so that every side of the rectangle 32 is covered by the resist film 40 while the depression 34 of the land 30 is partially exposed from the opening 42.

Furthermore, the resist film 40 can be formed so that a sum of the length of the first side 36 of the land 30 which is covered by the resist film 40 is larger than a sum of the second side 38 which is exposed through the opening 42. In this case, the land 30 can have a shape including the protrusion 33 and the depression 34, and the resist film 40 can be formed so that the protrusion 33 is partially covered by the resist film 40 while the depression 34 is partially exposed through the opening 42.

Following the above, a plating process is performed on the land 30 with the resist film 40 formed on the substrate 10. More specifically, a metal coating 50 is formed on the portion of the land 30 that is not covered by the resist film 40 (See FIG. 3). The metal coating 50 can be made of gold. The plating process can be performed using an electrolytic plating method. As previously explained, in the present embodiment the resist film 40 is formed so that the edge 45 of the opening 42 has the first portion 44 disposed on the substrate 10 and the second portion 46 disposed on the land 30. Since the substrate 10 has strong adhesiveness with the resist film 40, at least a part (the first portion 44) of the edge 45 of the opening 42 has strong adhesiveness with the substrate 10. Therefore, it is difficult for foreign matters to break in between the resist film 40 and the substrate 10 or between the resist film 40 and the land 30. Regarding the plating process, a solution for plating can be prevented from penetrating between the resist film 40 and the substrate 10 or between the resist film 40 and the land 30. Thus, it is possible to manufacture a reliable wiring board.

Note that the present invention is not limited to the above described embodiments, but can be modified in various ways. For example, the present invention includes configurations substantially the same as the configuration explained in the embodiments (e.g., a configuration with the same function, method, and result, or a configuration with the same object and effectiveness). Furthermore, the present invention includes configurations obtained by replacing a non-essential part of the configuration explained in the embodiments. Also, the present invention includes configurations capable of providing the same effectiveness or of achieving the same object as the configurations explained in the embodiments. In addition, the present invention includes configurations obtained by adding prior art to the configurations explained in the embodiments.

What is claimed is:

1. A method of manufacturing a wiring board, comprising:
performing a plating process on a land, the land having a generally rectangular shape including at least one inwardly extending depression formed in a side thereof, the land being on a substrate with a wire having the land formed thereon, the substrate having a resist film formed thereon, the resist film being on the land and the wire and having an opening exposing at least a center of the land and a part of a periphery of the land corresponding to the at least one depression, the opening having a generally rectangular shape and being formed so that a first portion of an edge of the opening corresponding to the at least one depression is disposed on the substrate and a second portion of the edge of the opening is disposed on the land.

2. A method of manufacturing a wiring board, comprising
forming a resist film on a substrate with a wire having a land having a shape including a depression formed thereon, the resist film having an opening exposing at least a center of the land, so that, taking a smallest circumscribing rectangle of the land as a reference, every side of the rectangle is covered by the resist film while the depression of the land is partially exposed through the opening; and
performing a plating process on the land with the resist film formed.

3. A method of manufacturing a wiring board, comprising:
forming a resist film on a substrate with a wire having a land formed thereon, the land having a generally rectangular shape including at least one inwardly extending depression formed in a side thereof, the resist film being formed on the wire and the land with an opening exposing at least a part of a periphery of the land corresponding to the at least one depression and a center of the land, the opening having a generally rectangular shape and being formed so that a sum of lengths of the periphery of the land covered by the resist film is larger than a sum of lengths of the periphery of the land exposed through the opening; and
performing a plating process on the land with the resist film formed.

4. The method of manufacturing a wiring board according to claim 2,
wherein the land has a generally rectangular shape, the depression extends inwardly from a side of the land, and the opening of the resist film has a generally rectangular shape corresponding to the shape of the land so that the depression is partially exposed through the opening.

* * * * *